United States Patent
Benner et al.

(10) Patent No.: US 6,312,068 B1
(45) Date of Patent: Nov. 6, 2001

(54) ROW OF ADJACENT SWITCHGEAR CABINETS

(75) Inventors: Rolf Benner, Herborn; Wolfgang Reuter, Burbach; Paul Root, Bad Endbach; Martina Köhler, Herborn; Udo Münch, Sinn, all of (DE)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 0 days.

(21) Appl. No.: 09/486,596

(22) PCT Filed: Aug. 27, 1998

(86) PCT No.: PCT/EP98/05452

§ 371 Date: Feb. 29, 2000

§ 102(e) Date: Feb. 29, 2000

(87) PCT Pub. No.: WO99/12237

PCT Pub. Date: Mar. 11, 1999

(30) Foreign Application Priority Data

Aug. 29, 1997 (DE) ................................. 197 37 667

(51) Int. Cl.$^7$ ................................. A47F 3/00; A47B 47/02
(52) U.S. Cl. ..................... 312/111; 312/265.5; 312/198
(58) Field of Search .......................... 312/111, 107, 312/108, 265.1, 265.2, 265.3, 265.4, 265.5, 265.6, 257.1, 265, 198, 223.1; 211/26, 182, 189, 194; 52/648.1, 653.1

(56) References Cited

U.S. PATENT DOCUMENTS

| 4,123,129 | 10/1978 | Butler | 312/257.1 |
| 4,974,386 | * 12/1990 | Eriksson et al. | 312/111 X |
| 5,350,227 | * 9/1994 | Katz | 312/198 |

FOREIGN PATENT DOCUMENTS

| 28 56 443 | 7/1980 | (DE) . |
| G 81 30 103.0 | 8/1982 | (DE) . |
| 26 33 914 C2 | 1/1986 | (DE) . |
| G 87 10 424.5 | 12/1987 | (DE) . |
| 41 38 887 C1 | 4/1993 | (DE) . |
| 44 13 819 C1 | 4/1995 | (DE) . |
| 195 20 084 C1 | 7/1996 | (DE) . |
| 477128 | * 6/1929 | (DE) ................ 312/265.5 |
| 0 189 061 A1 | 7/1986 | (EP) . |
| 0 157 344 B1 | 9/1988 | (EP) . |
| 0 538 540 A1 | 4/1993 | (EP) . |
| WO 95/17082 | 6/1995 | (WO) . |

* cited by examiner

Primary Examiner—Peter M. Cuomo
Assistant Examiner—James O. Hansen
(74) Attorney, Agent, or Firm—Pauley Petersen Kinne & Fejer

(57) ABSTRACT

In a row of adjacent switchgear cabinets with a frame, vertical frame pieces of adjacent switchgear cabinets are connected to each other and the top and bottom sides of the frame are closed by upper and lower metal sheets which have edges at least on the sides facing each other. The edges are staggered in relation to the outer sides of the adjacent frame pieces and form a type of groove with the end pieces of the edges and/or the profiled sides of the horizontal frame pieces facing each other. The grooves in an area of the top and bottom metal sheets of the adjacent switchgear cabinets are protected from water penetration because they are sealed respectively in the area of the top and/or bottom metal sheets of the switchgear cabinets by a covering strip running from the front face to the rear face of the switchgear cabinet flush with the top and bottom metal sheets.

13 Claims, 1 Drawing Sheet

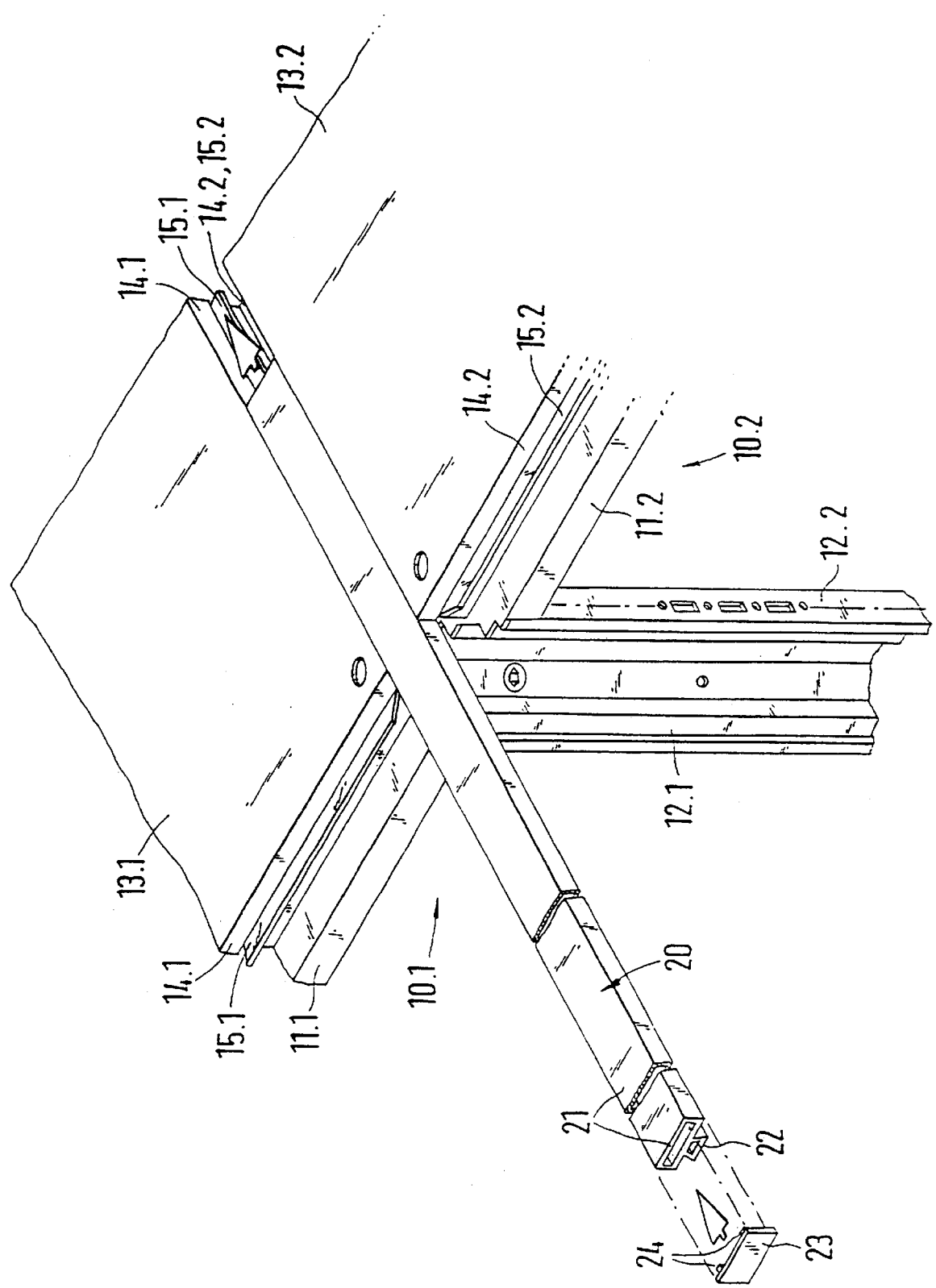

ROW OF ADJACENT SWITCHGEAR CABINETS

BACKGROUND OF THE INVENTION

1. Field of the Invention

This invention relates to a row of switchgear cabinets arranged next to each other, wherein vertical frame legs of adjoining switchgear cabinets are connected with each other and bottoms and tops of the racks are closed by bottom and top cover plates, and wherein the bottom and top cover plates have bevels on at least facing sides and bevels are set back with respect to outsides of the adjoining vertical frame legs and form a gutter with end sections of the bevels and/or profiled sides of facing horizontal frame legs.

2. Description of Prior Art

Conventional switchgear cabinets are individually placed, wherein bevels of a cover plate form a rain gutter which receives rainwater running off the cover plate and lets it drip down at a front and/or a back of the switchgear cabinet. The bevels are advantageous with individually placed switchgear cabinets, but with a row of switchgear cabinets arranged next to each other they do not block joint areas between the adjoining switchgear cabinets, so that water collects and can penetrate into interiors of the switchgear cabinets.

SUMMARY OF THE INVENTION

It is one object of this invention to definitely and simply close joint areas between adjoining switchgear cabinets in connection with a row of switchgear cabinets of a type as previously mentioned, without having to give up the advantage of satisfactory water removal by means of the bevels of the bottom and/or top plate when placing the switchgear cabinet as a single cabinet.

In accordance with this invention, this object is attained with gutters in an area of bottom and/or top plates of adjoining switchgear cabinets which are closed flush with the bottom and/or top plates from the front of the switchgear cabinets toward the rear with respective cover strips.

The bottom and/or the top are closed in flush planes using the cover strips, so that the joint areas are clearly sealed. If water enters between the cover strips and the bottom and/or top plate, the water is conducted out of the area of the joints by the bevels of the top and bottom plates and the profiled sides of the frame legs and is diverted at the front and/or back of the switchgear cabinets.

For a simple application of the cover strips, in one embodiment facing end sections of the bevels of bottom and/or top plates of adjoining switchgear cabinets are at a distance from each other and with a web formed on them, the cover strips extend between the end sections and behind them.

Then the assembly can be performed in such a way that the cover strips are snapped into the gutters between the bottom and/or top plates of adjoining switchgear cabinets, transversely with respect to a longitudinal section, or the cover strips are pushed in a longitudinal direction into the gutters between the bottom and/or top plates of adjoining switchgear cabinets.

In accordance with one embodiment of this invention, a good support of the cover strips in the gutters of adjoining bottom and/or top plates is achieved because the end sections form an acute angle with respect to the leading sections, and the webs of the cover strips are designed as dovetailed webs with an appropriate inclination.

If the cover strips are formed as sections of a strand of a plastic material, they can be produced simply and cost-effectively by a plastic extrusion process. For reducing production costs it is also possible to design the cover strips as sections of a strand of plastic material.

In accordance with a further embodiment, ends of the hollow cover strips can be closed with cover plates, which are introduced with plug connectors formed on them into hollow spaces of the hollow cover strips, and are there held by a snug fit and/or a press fit.

BRIEF DESCRIPTION OF THE DRAWING

This invention is described in the drawing showing a joint area between cover plates of two adjoined switchgear cabinets, in a perspective partial view.

DESCRIPTION OF PREFERRED EMBODIMENTS

Only partial areas of a row of adjoining switchgear cabinets 10.1 and 10.2 are shown, including the upper, front, horizontally extending frame leg 11.1 and the right, front, vertically extending frame leg 12.1 of the rack of the left switchgear cabinet 10.1. The upper, front horizontally extending frame leg 11.2 and the left, front vertically extending frame leg 12.2 of the right switchgear cabinet 10.2 are partially shown. Frame legs of the racks meet in a similar manner in the area of the backs of the two switchgear cabinets 10.1 and 10.2. The vertical frame legs 12.1 and 12.2 resting against each other of adjoining switchgear cabinets 10.1 and 10.2 of the row are fixedly connected with each other, for which a variety of fastening methods exits.

The cover plates 13.1 and 13.2 of the switchgear cabinets 10.1 and 10.2 are peripherally beveled in an L-shape, wherein the leading sections 14.1 and 14.2 are set back with respect to the outsides. If the switchgear cabinets 10.1 and 10.2 are individually set up, the end sections 15.1 and 15.2 of the cover plates 13.1 and 13.2 form a sort of a rain gutter, which conducts the rainwater collecting on the cover plate 13.1, or respectively 13.2, away toward the front, or respectively rear of the switchgear cabinet 10.1, or respectively 10.2. The rain gutter can extend over all sides of the cover plate 13.1, or respectively 13.2, and can be open in the corner areas of the cover plate.

If the switchgear cabinets 10.1 and 10.2 are lined up and fixedly connected with each other, gutters are created at the joint areas of adjoining switchgear cabinets 10.1 and 10.2, which are limited by the bevels of the cover plates 13.1 and 13.2. The depth struts of the aligned switchgear cabinets rest flush against each other and are covered, except for the distance between the facing end sections 15.1 and 15.2 of the bevels of the cover plates 13.1 and 13.2.

To seal this joint area, a cover strip 20 is used, which extends from the front to the back of the switchgear cabinets 10.1 and 10.2. A web 22 is formed on the underside of the cover strip 20, which extends between and behind the end sections 15.1 and 15.2, so that it can be fixed in place in the gutter without any additional fastening means. In this case the cover strip 20 can be snapped into the gutter transversely to its longitudinal extension, or pushed into the gutter in the longitudinal direction and held therein.

The cover strip 20 is a section of a plastic strand, wherein it can be cost-effectively produced by means of a plastic extrusion process as a hollow profiled section 21 with a formed-on web 22.

If the end sections 15.1 and 15.2 of the bevels are arranged at an acute angle with respect to their leading sections 14.1 and 14.2, the web 22 on the cover strip 20 can also be embodied as a dovetailed web, whose flanks are matched to this angle. The support of the cover strip 20 in the assembled gutter is thus improved.

The ends of the hollow cover strip 20 are closed by means of cover plates 23, which have formed plug connectors.

The plug connectors 24 are pushed into hollow spaces of the hollow profiled section 21, and are held therein by means of a snug fit and/or a press fit.

The switchgear cabinets 10.1 and 10.2 can be closed flush in the same manner by means of bottom plates and cover strips, if required.

What is claimed is:

1. In a row of switchgear cabinets with racks arranged next to each other, wherein vertical frame legs of the adjoining switchgear cabinets are connected with each other, and bottoms and tops of the racks are closed by bottom cover plates and top cover plates connectable to the racks, and wherein the bottom cover plates and the top cover plates have bevels at least on facing sides, the improvement comprising:

the bevels set back with respect to outsides of the adjoining vertical frame legs and forming a gutter with end sections of at least one of the bevels and profiled sides of facing horizontal frame legs, and an area between at least one of the bottom cover plates and the top cover plates (13.1, 13.2) of the adjoining switchgear cabinets (10.1, 10.2) being closed flush with the at least one of the bottom cover plates and the top cover plates (13.1, 13.2) from a front of the switchgear cabinets (10.1, 10.2) toward a rear of the switchgear cabinets (10.1, 10.2) by a cover strip (20).

2. In the row of switchgear cabinets in accordance with claim 1, wherein facing end sections (15.1, 15.2) of the bevels of the at least one of the bottom cover plates and the top cover plates (13.1, 13.2) of the adjoining switchgear cabinets (10.1, 10.2) are at a distance from each other, and the cover strip (20) extends between and behind the end sections (14.1, 14.2) by a formed-on web (22).

3. In the row of switchgear cabinets in accordance with claim 1, wherein the cover strip (20) is formed as a section of a strand of a plastic material.

4. In the row of switchgear cabinets in accordance with claim 1, wherein the cover strip (20) is snapped transversely with respect to a longitudinal direction into a gutter between the at least one of the bottom cover plates and the top cover plates (13.1, 13.2) of the adjoining switchgear cabinets (10.1, 10.2).

5. In the row of switchgear cabinets in accordance with claim 1, wherein the cover strip (20) is inserted in a longitudinal direction into a gutter between the at least one of the bottom cover plates and the top cover plates (13.1, 13.2) of the adjoining switchgear cabinets (10.1, 10.2).

6. In a row of switchgear cabinets with racks arranged next to each other, wherein vertical frame legs of the adjoining switchgear cabinets are connected with each other, and bottoms and tops of the racks are closed by bottom cover plates and top cover plates connectable to the racks, and wherein the bottom cover plates and the top cover plates have bevels at least on facing sides, the improvement comprising:

the bevels set back with respect to outsides of the adjoining vertical frame legs, and forming a gutter with end sections of at least one of the bevels and profiled sides of facing horizontal frame legs, and an area between at least one of the bottom cover plates and the top cover plates (13.1, 13.2) of the adjoining switchgear cabinets (10.1, 10.2) being closed flush with the at least one of the bottom cover plates and the top cover plates (13.1, 13.2) from a front of the switchgear cabinets (10.1, 10.2) toward a rear of the switchgear cabinets (10.1, 10.2) by a cover strip (20); and wherein facing end sections (15.1, 15.2) of the bevels of the at least one of the bottom cover plates and the top cover plates (13.1, 13.2) of the adjoining switchgear cabinets (10.1, 10.2) are at a distance from each other, and the cover strip (20) extends between and behind the end sections (14.1, 14.2) by a formed-on web (22); and wherein the facing end sections (15.1, 15.2) form an acute angle with respect to the leading end sections (14.1, 14.2), and the web (22) of the cover strip (20) being a dovetailed web.

7. In the row of switchgear cabinets in accordance with claim 6, wherein the cover strip (20) is formed as a section of a strand of a plastic material.

8. In the row of switchgear cabinets in accordance with claim 7, wherein the strand of the plastic material is formed as a hollow profiled section (21), and cover strip ends of the cover strip (20) are closed by cover plates (23).

9. In the row of switchgear cabinets in accordance with claim 8, wherein the cover plates (23) have formed plug connectors (24) introduced into hollow spaces of the cover strip (20) and are held in the hollow spaces by at least one of a snug fit and a press fit.

10. In the row of switchgear cabinets in accordance with claim 9, wherein the cover strip (20) is snapped transversely with respect to a longitudinal direction into a gutter between the at least one of the bottom cover plates and the top cover plates (13.1, 102.2 10.2).

11. In the row of switchgear cabinets in accordance with claim 9, wherein the cover strip (20) is inserted in a longitudinal direction into a gutter between the at least one of the bottom cover plates and the top cover plates (13.1, 13.2) of the adjoining switchgear cabinets (10.1, 10.2).

12. In a row of switchgear cabinets with racks arranged next to each other, wherein vertical frame legs of the adjoining switchgear cabinets are connected with each other, and bottoms and tops of the racks are closed by bottom cover plates and top cover plates connectable to the racks, and wherein the bottom cover plates and the top cover plates have bevels at least on facing sides, the improvement comprising:

the bevels set back with respect to outsides of the adjoining vertical frame legs, and forming a gutter with end sections of at least one of the bevels and profiled sides of facing horizontal frame legs, and an area between at least one of the bottom cover plates and the top cover plates (13.1, 13.2) of the adjoining switchgear cabinets (10.1, 10.2) being closed flush with the at least one of the bottom cover plates and the top cover plates (13.1, 13.2) from a front of the switchgear cabinets (10.1, 10.2) toward a rear of the switchgear cabinets (10.1, 10.2) by a cover strip (20);

wherein the cover strip (20) is formed as a section of a strand of a plastic material; and wherein the strand of the plastic material is formed as a hollow profiled section (21), and cover strip ends of the cover strip (20) are closed by cover plates (23).

13. In the row of switchgear cabinets in accordance with claim 12, wherein the cover plates (23) have formed plug connectors (24) introduced into hollow spaces of the cover strip (20) and are held in the hollow spaces by at least one of a snug fit and a press fit.

* * * * *